US009203136B2

(12) United States Patent
Huang et al.

(10) Patent No.: US 9,203,136 B2
(45) Date of Patent: Dec. 1, 2015

(54) ANTENNA SYSTEM GENERATING QUASI RELATIVISTIC RADIATION (71) Applicant: National Tsing Hua University, Hsinchu (TW)

(72) Inventors: Yen-Chieh Huang, Hsinchu (TW); Ming-Hsiung Wu, Hsinchu (TW); Kuan-Yan Huang, Hsinchu (TW); Chia-Hsiang Chen, Hsinchu (TW); Yi-Chu Wang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 82 days.

(21) Appl. No.: 14/160,258

(22) Filed: Jan. 21, 2014

(65) Prior Publication Data
US 2015/0162108 A1 Jun. 11, 2015

(30) Foreign Application Priority Data

Dec. 9, 2013 (TW) .............................. 102145076 A (51) Int. Cl.
*H01Q 13/08* (2006.01)
*H01L 33/06* (2010.01)
*H01Q 1/00* (2006.01)

(52) U.S. Cl.
CPC . *H01Q 1/00* (2013.01); *H01L 33/06* (2013.01)

(58) Field of Classification Search
CPC .... G01N 21/3581; H01L 33/06; H01Q 13/08; H01Q 9/0485
USPC ........ 250/492.3, 493.1; 257/E31.093; 385/15
See application file for complete search history.

(56) References Cited

U.S. PATENT DOCUMENTS

| 5,937,118 A * | 8/1999 | Komori ........................... 385/27 |
| 6,844,688 B1 * | 1/2005 | Williams et al. .............. 315/505 |
| 2003/0016358 A1 * | 1/2003 | Nagashima et al. .......... 356/364 |
| 2005/0093023 A1 * | 5/2005 | Raspopin et al. ............. 257/202 |
| 2006/0097809 A1 * | 5/2006 | Mishonov et al. ............ 331/167 |
| 2006/0153262 A1 * | 7/2006 | Barbieri et al. ............. 372/43.01 |
| 2006/0289761 A1 * | 12/2006 | Nabet et al. ................. 250/336.1 |
| 2007/0280303 A1 * | 12/2007 | Koch et al. ........................ 372/4 |
| 2008/0193752 A1 * | 8/2008 | Klein et al. .................... 428/364 |
| 2008/0309577 A1 * | 12/2008 | Mittleman et al. ............ 343/850 |

(Continued)

OTHER PUBLICATIONS

Li et al., Terahertz radiation from a wire target irradiated by an ultra-intense laser pulse, May 18, 2007, Physics of Plasma, vol. 14, 054505-1 to 054505-4.*

*Primary Examiner* — David A Vanore
(74) *Attorney, Agent, or Firm* — Jackson IPG PLLC; Demian K. Jackson (57) ABSTRACT

An antenna system that generates radiation similar to that generated by a relativistic charged particle is provided. The antenna system includes a conducting wire carrying a current pulse with a net charge, called a quasi charged particle, which propagates near the speed of light and emits radiation. Preferably, the quasi charged particle is generated by using a pulsed laser to knock out electrons from the conducting wire. While propagating on the conducting wire near the speed of light, the quasi charged particle generates a synchrotron like radiation from a bent of the wire, an undulator like radiation from a sinusoidal or helical structure of the wire, a diffraction like radiation from an aperture transmitting the wire, a Smith-Purcell like radiation from a corrugated grating surface next to the wire, and a greatly wavelength-contracted undulator like radiation from an undulator with the wire aligned along the undulator axis.

16 Claims, 8 Drawing Sheets

(56) References Cited

U.S. PATENT DOCUMENTS

| | | | |
|---|---|---|---|
| 2009/0284126 A1* | 11/2009 | Protz et al. | 313/495 |
| 2010/0072405 A1* | 3/2010 | Yu et al. | 250/493.1 |
| 2010/0220327 A1* | 9/2010 | Kiwa et al. | 356/432 |
| 2014/0045700 A1* | 2/2014 | Knap et al. | 505/180 |

* cited by examiner

ANTENNA SYSTEM GENERATING QUASI RELATIVISTIC RADIATION

FIELD OF THE INVENTION

The present invention relates to an antenna system, and, in particular, to a radiation antenna system that generates radiation from an electric pulse carrying a net charge moving on a conducting wire near the speed of light, having a radiation characteristic similar to that generated by a relativistic charged particle moving in vacuum.

BACKGROUND OF THE INVENTION

Electromagnetic radiation has been very useful in a wide range of applications, such as communication, imaging, remote sensing, material processing, medical therapy, scientific investigation, etc. It is well known that radiation generation requires acceleration or deceleration (acceleration in the negative sense) of charged particles. For example, an alternating-current (AC) electric power supply may drive electrons in a radiation antenna to generate electromagnetic radiation. In prior arts, the radiation frequency from a stationary antenna is the same as the driving frequency of the power supply, while the radiation frequency depending on the moving speed of an electric pulse in an antenna has never been considered.

Radiation can also be generated from the acceleration of a moving charge in vacuum. When a radiation source moves relative to a radiation detector, the detected radiation frequency is shifted by an amount depending on the direction and speed of the radiation source. To generate a short-wavelength radiation, one may take advantage of the strong frequency up-shift of the radiation from a transversely accelerated charged particle moving longitudinally toward a radiation detector at nearly the speed of light. When an object moves near the speed of light, called a relativistic object, its physics is governed by the theory of relativity. Whether a moving object is in the relativistic regime is usually characterized by the so-called Lorentz factor, given by $\gamma = 1/\sqrt{1-\beta^2}$, where $\beta = v/c$ with v the speed of the particle and c the speed of light in vacuum. A relativistic object moves near the speed of light v~c, having a Lorentz factor $\gamma \gg 1$. The radiation generated from a relativistic charged particle is known as "relativistic radiation". The frequency of relativistic radiation is characterized by two important effects, Lorentz contraction and relativistic Doppler shift. The former is a contraction of a spatial length in the moving object's frame according to the theory of special relativity. The later is the usual Doppler shift corrected by the theory of the special relativity when a radiation source moves near the speed of light. Both effects greatly shorten the radiation wavelength at a detector when a radiation source moves toward the detector. Another characteristic of relativistic radiation is its radiation power strongly depending on the speed of the radiation source. A near-speed-of-light radiation source can follow closely the generated speed-of-light radiation field, leading to concentration of the radiation energy in a short temporal duration or high power. Relativistic radiation has covered a wide spectral range from microwave to x-ray. Notable relativistic radiations include undulator radiation, synchrotron radiation, free-electron laser, Smith-Purcell radiation, Cherenkov radiation, backward-wave oscillation, transition radiation, diffraction radiation, and so on.

As a first example of relativistic radiation, synchrotron radiation is generated when a relativistic charged particle, usually an electron, is bent by a magnetic field. The high-frequency cutoff of synchrotron radiation is expressed by $$f_c = \frac{3\gamma^3}{2\pi}\left(\frac{c}{\rho}\right) \quad (1)$$

where $\rho$ is the bending radius of curvature of the charge's trajectory. As can be seen from (1), the radiation spectrum is broadband, extending into the valuable VUV and soft x-ray wavelengths for a highly relativistic electron with GeV energy ($\gamma \sim 2000$ for 1-GeV electron).

As a second example, narrow-band undulator radiation is generated from relativistic electrons traversing a magnetic structure, called an undulator, in which an alternating transverse magnetic field forces axially moving electrons to perform a quiver motion and emit a radiation in the axial direction. Assume the undulator axis is along z. From the theory of special relativity the undulator period $\lambda_u$ in the electron moving frame is contracted by a Lorentz factor (Lorentz contraction), given $\lambda_u/\gamma_z$, where $\gamma_z = 1/\sqrt{1-\beta_z^2} = 1/\sqrt{1-(\beta^2-\beta_\perp^2)}$ is the longitudinal Lorentz factor with $\beta_z = \bar{v}_z/c$ being the average longitudinal speed of the electron $\bar{v}_z$ normalized to the speed of light c and $\beta_\perp$ being the transverse component of the $\beta$ factor. The oscillation frequency of the electrons in the electron rest frame is therefore $f' = (\lambda_u/(\gamma_z v_z))^{-1}$. Owing to the relativistic Doppler shift, the radiation frequency detected in the laboratory frame along z is shifted by a factor $\sqrt{(1+\beta_z)/(1-\beta_z)}$, resulting in the well known expression for the undulator-radiation wavelength in the axial direction:

$$\lambda_r = \lambda_u\left(\frac{c}{\bar{v}_z} - 1\right) = \lambda_u\left(\frac{1}{\beta_z} - 1\right). \quad (2)$$

In the relativistic limit $v_z \sim c$ and $\gamma_z \gg 1$, Eq. (2) reduces to $\lambda_r \sim \lambda_u/2\gamma_z^2$. For $v_z \sim c$ to be valid, the electron's quiver motion has to be small or $\beta_\perp \ll 1$. In this limit, $\beta_z \sim \beta$ and $\gamma_z \sim \gamma$ for a relativistic electron. Therefore, the radiation wavelength $\lambda_r$ from a relativistic electron can be a small fraction of the undulator wavelength $\lambda_u$. This relativistic mechanism helps to generate valuable short-wavelength radiation for a variety of applications.

In relativistic radiation, the radiation is usually generated from a group of relativistic electrons of a certain temporal length, called an electron pulse. When the electron pulse length is much smaller than the radiation wavelength, all the electrons radiate coherently at nearly the same phase of the electromagnetic field. The radiation energy for such coherent radiation is proportional to the square of the radiation field, having a value proportional to the square of the total charge participating in the radiation. On the other hand, when the electron pulse length is significantly longer than the radiation wavelength, electrons located at different radiation phases emit radiation incoherently and give a total radiation energy linearly proportional to the total charge participating in the radiation. Apparently coherent radiation can be much more powerful than incoherent radiation due to the quadratic dependence of the radiation energy on the radiating charge.

The spectral energy of relativistic radiation, radiation energy per unit radiation bandwidth, can be greatly improved when a periodic electron-pulse train transverses a radiation device. The radiation field is coherently and constructively added at the frequency or the harmonics of the frequency of the electron pulses. For example, the fractional radiation line width from N periodic electron pulses is 1/N, which can be a very small value for a large N.

In prior arts, the near-speed-of-light charged particles, usually electrons, are prepared by a large-size and expensive particle accelerator system. The radiation device, such as the undulator or a bending magnet, is also very bulky, heavy, and expensive. Furthermore, dumping relativistic charged particles after an application imposes serious x-ray and pray radiation hazard to a user or an operator of relativistic radiation apparatus. Consequently, most relativistic radiation is only available in a national-scale user facility having careful and extensive radiation shielding.

The first valuable insight of the present invention is to recognize that a density wave of charges or an alternating electric signal in a conducting wire can propagate at nearly the speed of light and can radiate from a properly designed antenna. Usually, an antenna wire carrying an electric signal with positive and negative cycles, containing no net charge when being averaged over the whole wire or a cycle of the signal oscillation. As a second valuable insight of the present invention, if one could create a current pulse carrying a net charge on a conducting wire, the current pulse or a pulsed charge wave will propagate near the speed of light along the wire just like a pulse of real relativistic charges propagating in free space. The net-charge pulse does not possess a mass and is therefore termed as a "quasi charged particle" in the present invention. The relativistic-like radiation generated from a quasi charged particle moving near the speed of light is termed as "quasi relativistic radiation" for what follows.

In principle, quasi relativistic radiations from positive and negative quasi charged particles differ only in the polarity of the radiation field. In practice, it is easier to generate a positive quasi charged particle, effectively void of electrons, by knocking out a short group of electrons from a conducting wire. This positive quasi charged particle can propagate nearly the speed of light on the wire just like a positive relativistic charged particle, a positron or proton pulse, propagating in vacuum. As a scheme of the present invention, a short-pulse laser knocks out electrons from an antenna wire by virtue of photoemission to create such a near-speed-of-light positive quasi charged particle to propagate along a structured antenna wire to emit the quasi relativistic radiation. To an observer measuring radiation, the radiation generated by a quasi charged particle without a mass has no difference from that generated by a real charged particle with a mass, as long as both the particles carry the same amount of charge and move along the same trajectory with the same speed. From the theory of electrodynamics, mass is simply not in the equation of calculating the radiation generated by a charge. As an embodiment of the present invention, undulator-like radiation can be generated by exciting a quasi charged particle on an antenna wire with the shape of the wire mimicking the trajectory of a relativistic charge in an undulator; synchrotron-like radiation can be generated by exciting a quasi charged particle on an antenna wire with the wire bent with a curvature mimicking the trajectory of a relativistic charge traversing a bending magnet; diffraction radiation can be generated by exciting a quasi charged particle on an antenna wire with the wire and thus the quasi charged particle transmitting through an aperture. Another embodiment of the present invention is to simply insert a straight conducting wire carrying a quasi charged particle to the axis of an undulator, in which the quasi charged particle performs a small amplitude quiver motion on the wire, while propagating down the straight wire on the undulator axis, to emit undulator-like radiation with a much reduced radiation wavelength in the limit of $\gamma_z$ approaching $\gamma$. Similar embodiments of the present invention are a Smith-Purcell grating, a traveling-wave tube, and a backward-wave oscillator with their axes arranged with a conducting wire carrying a quasi charged particle. The present invention does not have the complexity of an expensive particle accelerator system and avoids the inconvenience of operating a relativistic-radiation machine in a radiation shielded area. All the aforementioned and additional embodiments of the present invention will be further defined below.

The present invention has apparent advantages over the prior arts in reducing the cost and complexity for generating the relativistic radiation. It is therefore the intention of the present invention to disclose a new scheme and apparatus of generating relativistic radiation to overcome the aforementioned drawbacks in the prior arts.

SUMMARY OF THE INVENTION

In accordance with one aspect of the present invention, a radiation antenna system employing a conducting wire carrying a quasi charged particle to generate a quasi relativistic radiation is provided. The radiation antenna system includes a laser excitation unit, a quasi charged particle generation unit, and a radiation generation unit. The laser excitation system provides a short laser pulse to knock out electrons from a photocathode spot or a photoemitter of a structured conducting wire in the quasi charged particle generation unit and generate a fast moving pulsed charge wave carrying a net charge, called a quasi charged particle, to generate a radiation from the radiation generation unit with radiation characteristics similar to those generated by a real relativistic charge.

Preferably, the laser's photon energy in the laser excitation system is larger than the work function of the photoemitter in the quasi charged particle generation unit.

Preferably, the laser pulse length of the laser excitation system is shorter than the designed radiation wavelength in the radiation generation unit.

Preferably, a laser pulse in the quasi charged particle generation unit is incident on a single spot on the conducting wire to generate a single quasi charged particle propagating on the wire. In the case of having repeated laser pulses, repeated quasi charged particles can be sequentially excited on the wire; preferably the repetition rate of the laser pulses and thus that of the quasi charged particles is the same as or equal to one of the sub-harmonics of the designed radiation frequency in the radiation generation unit.

In accordance with another aspect of generating a train of quasi charged particles, preferably a laser pulse in the quasi charged particle generation unit is split into a plurality of spots incident along the conducting wire to simultaneously generate an array of quasi charged particles propagating on the wire with adjacent quasi particles separated by a distance equal to the designed radiation wavelength or an integer multiple of the designed radiation wavelength in the radiation generation unit.

Preferably, the conducting wire in the radiation generation unit is selected from a group consisting of: a bent wire, a ring wire, a helical wire, a tapered helical wire, a sinusoidal wire, a tapered sinusoidal wire, and a straight wire.

Preferably, the conducting wire in the radiation generation unit is a straight one arranged along the longitudinal direction of a selection of relativistic radiation devices, including an undulator, a Smith-Purcell grating, a traveling wave tube, a backward-wave oscillator, and a diffraction aperture.

In accordance with another aspect of the present invention using a laser excitation source having photon energy lower than the working function of the photoemitter, a high laser intensity can be used to induce multi-photon emission from the photoemitter or an anode electrode with a positively biased voltage can be arranged adjacent to the photoemitter in the quasi charged particle generation unit to assist the photoemission through the Schottky effect.

In accordance of an additional aspect of the present invention, the conducting wire in the quasi charged particle generation unit and the radiation generation unit is installed in vacuum to assist photoemission, to avoid charge neutralization from air, and to prevent the generated radiation from being absorbed in air.

Additional objects and advantages of the invention will be set forth in the following descriptions with reference to the accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
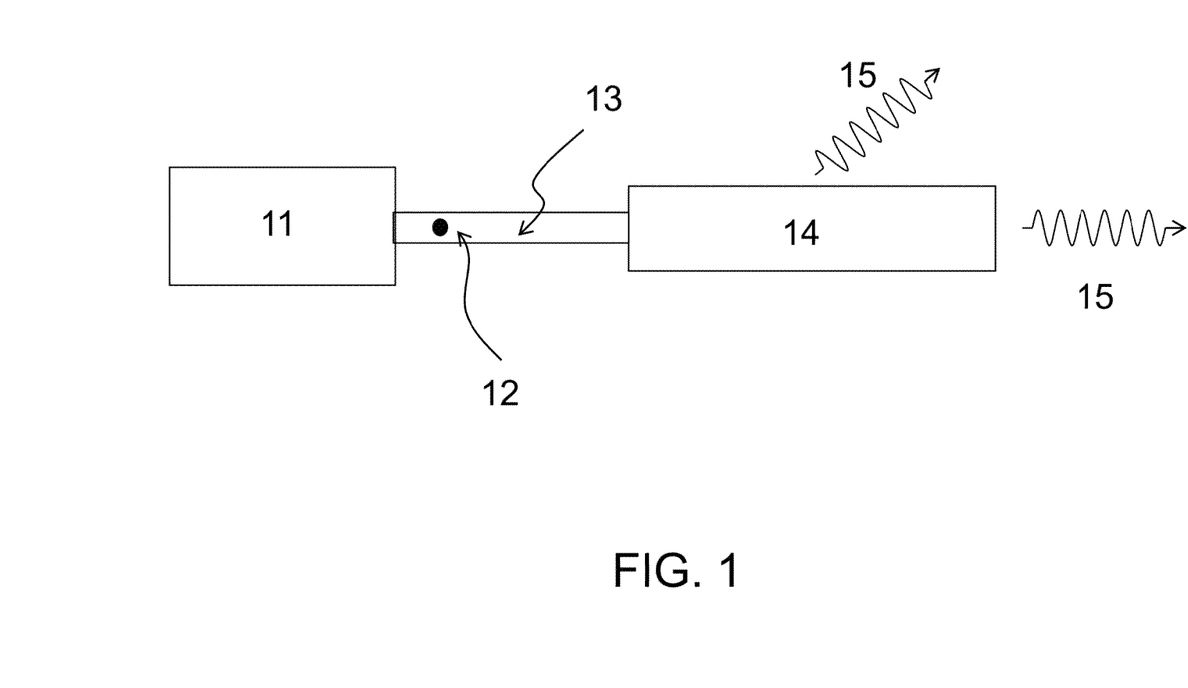
FIG. 1 is a schematic diagram showing a prior-art relativistic radiation apparatus, in which a particle accelerator 11 injects accelerated charged particles 12 into a vacuum transport line 13 connecting to a radiation generation unit 14. The radiation generation unit is one usually selected from an undulator, a bending magnet, a diffraction aperture, a transition radiation foil, a Smith-Purcell grating, a traveling wave tube, a backward wave oscillator, etc.
Figure 2:
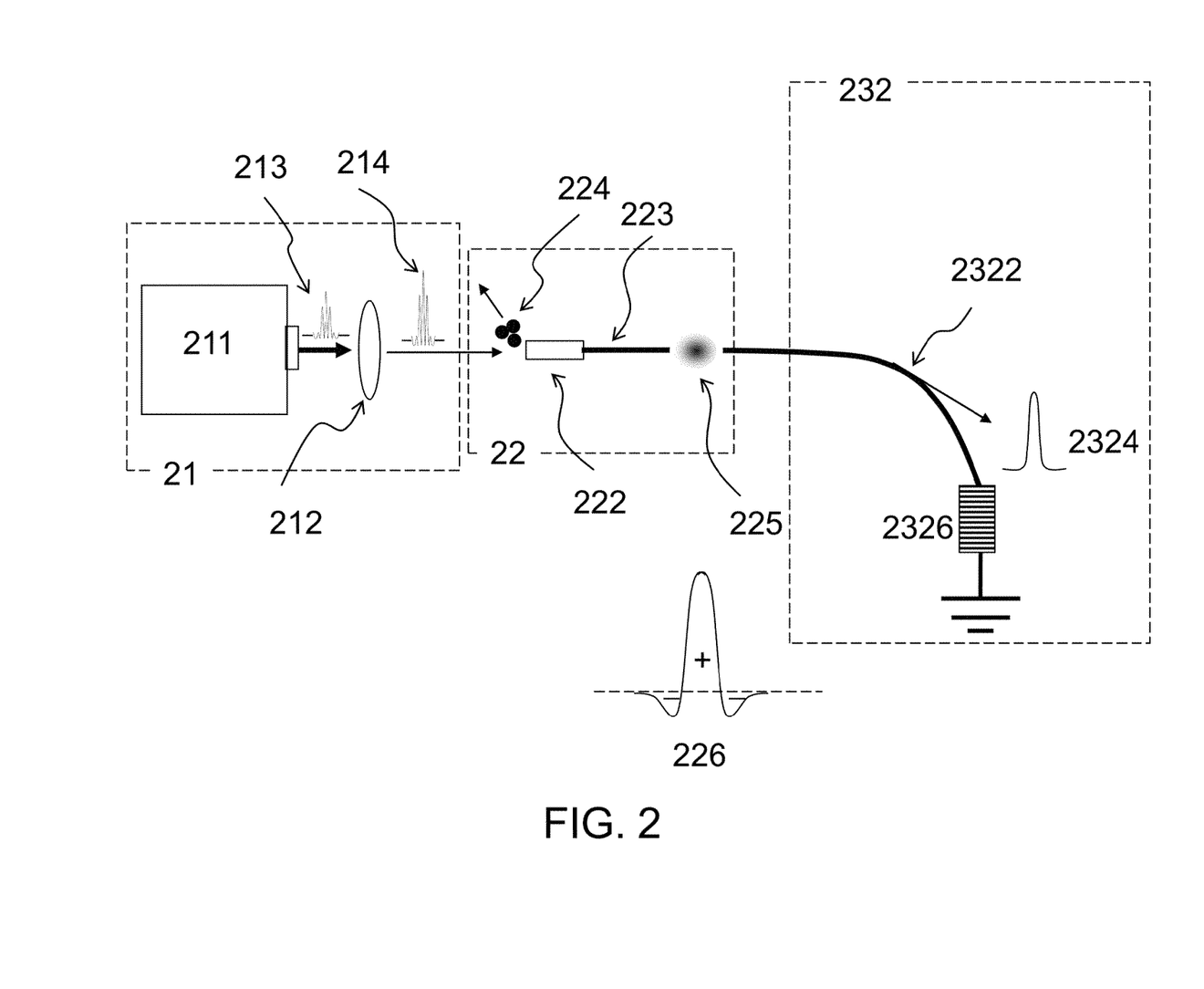
FIG. 2 depicts an antenna system generating a bending-magnet like radiation according to a first preferred embodiment of the present invention.

Refer to FIG. 2, which shows an antenna system radiating a kind of quasi relativistic radiation, called "quasi bending-magnet radiation", according to a first preferred embodiment of the present invention. The laser excitation unit 21 comprises a laser source 211 and a laser focusing device 212. The laser source 211 emits a short laser pulse 213, which is focused by the laser focusing device 212 and becomes a high intensity laser pulse 214 before entering a quasi charged particle generation unit 22. The quasi charged particle generation unit 22 contains a photoemitter or a photocathode 222 connected to a conducting wire 223. In the simplest case, the photoemitter is just a designated spot on the conducting surface of the wire. The intense laser pulse 214 is incident on the photoemitter 222 to induce electron emission 224 and generate a pulsed charge wave, called the quasi charged particle 225, propagating on the conduction wire 223. Owing to oscillation of electrons in a conducting wire, the amplitude profile of the pulsed charge wave 226 may contain a positively charged primary peak surrounded by fast attenuating cycles. The primary peak of the pulsed charge wave 226 has a temporal width comparable to that of the laser pulse 214. Preferably, the photon energy of the laser pulse 213 is larger than the work function of the photoemitter 222. Preferably, the photoemitter 222 is arranged in vacuum for ease of photoemission. Preferably, the photoemitter 222 is located near a positively biased anode electrode, which assists emission of electrons through the Schottky effect. The conducting wire 223 is extended into the radiation generation unit 232 with a bending curvature 2322 on the wire. The quasi charged particle 225 propagating along the wire to emit an electromagnetic radiation pulse 2324 along the tangent of the curvature 2322 much similar to a real charged particle traversing a bending magnet to emit a radiation. Finally, the quasi charged particle 225 is dumped into an impedance network 2326. When the impedance network 2326 is matched to the impedance of the conducting wire 223, the quasi charged particle 225 is absorbed in the impedance network 2326 without reflection. In case that the quasi charged particle is to be re-used in the backward direction, an impedance mismatch can be introduced into the impedance network 2326 to cause reflection of the quasi charged particle.

Figure 3:
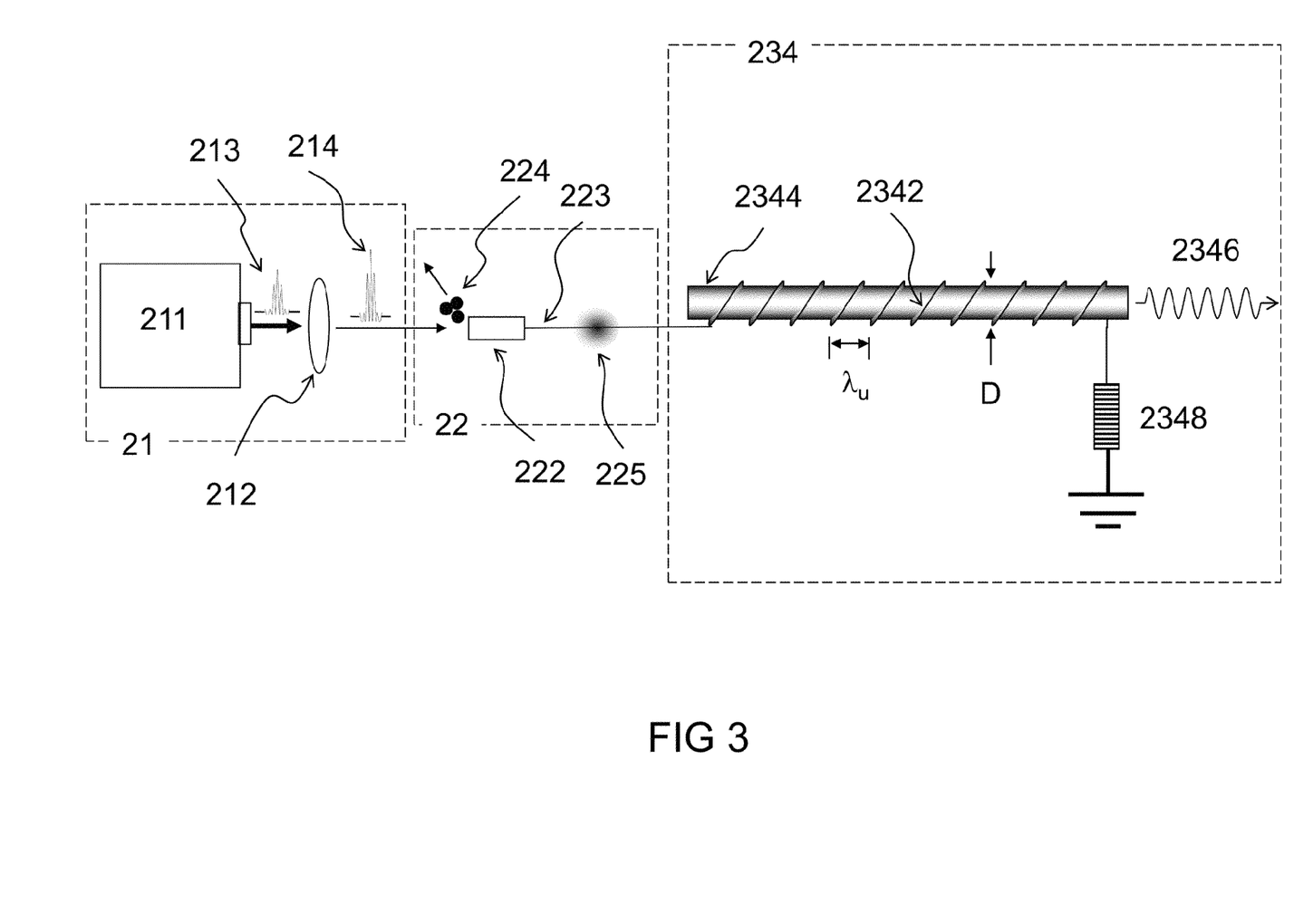
FIG. 3 depicts an antenna system generating an undulator like radiation according to a second preferred embodiment of the present invention.

Refer to FIG. 3, which shows an antenna system radiating a kind of quasi relativistic radiation, called "quasi helical undulator radiation", according to a second preferred embodiment of the present invention. The laser excitation unit 21 first emits an intense laser pulse 214 to excite a quasi charged particle 225 propagating on a conducting wire 223 in the quasi charged particle generation unit 22. The conducting wire 223 is extended into the radiation generation unit 234 and is twisted into a helix 2342 with a pitch $\lambda_u$ and diameter of D. If necessary, the wire can be wrapped on and supported by a circular tube 2344, although the moving speed of the quasi charged particle 225 on the helix could be affected by the tube material. The quasi charged particle 225 propagating along the helix 2342 to emit radiation 2346 much similar to a real charged particle propagating inside a helical undulator to emit undulator radiation. Finally the quasi charged particle 225 is dumped into the impedance network 2348. To have coherent radiation, preferably, the length of the quasi charged particle is smaller than the radiation wavelength. The radiation wavelength in this preferred embodiment is the same as that shown in Eq. (2) for undulator radiation, except that $\vec{v}_z$ now refers to the average speed of the quasi charged particle along the axial direction of the helix 2342. By taking into account the transverse motion of the quasi charged particle when calculating $\vec{v}_z$, the radiation wavelength becomes $$\lambda_r = \frac{\sqrt{(\pi D)^2 + \lambda_u^2}}{\beta} - \lambda_u, \quad (3)$$

where $\beta = v/c$ now refers to the speed of the quasi charged particle on the helical wire normalized to the speed of light. When a frequency modulated radiation is desired, one advancement of the second preferred embodiment of the present invention is to vary the diameter or the pitch of the helix as a function of the axial distance z, so that the emitted radiation frequency is a function of z or time z=$v_z$×t, given by $$\lambda_r(z) = \frac{\sqrt{\pi^2 D(z)^2 + \lambda_u^2(z)}}{\beta} - \lambda_u(z) \quad (4)$$

Another advancement of the third preferred embodiment is to replace the helical wire with a sinusoidal wire, mimicking the charge trajectory in a linear undulator, permitting generation of a "quasi linear undulator radiation" from a quasi charged particle.

Figure 4:
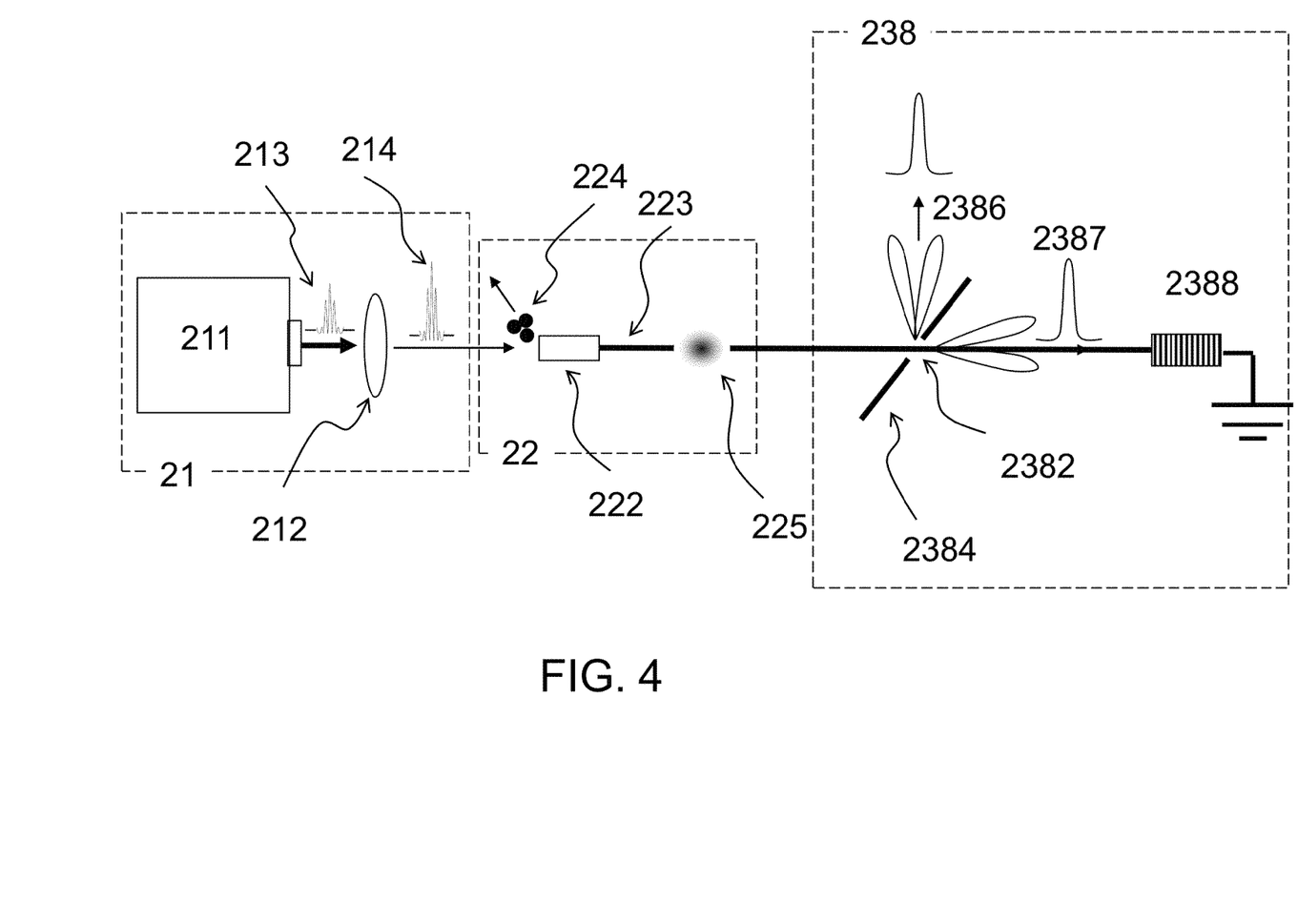
FIG. 4 depicts an antenna system generating a diffraction like radiation according to a third preferred embodiment of the present invention.

Refer to FIG. 4, which shows an antenna system radiating a kind of quasi relativistic radiation, called "quasi diffraction radiation", according to a third preferred embodiment of the present invention. The laser excitation unit 21 first emits an intense laser pulse 214 to excite a quasi charged particle 225 propagating on a conducting wire 223 in the quasi charged particle generation unit 22. The wire 223 carrying the quasi charged particle 225 is pulled through an aperture 2382 in a thin material plate 2384 in a radiation generation unit 238. The material plate can be conducting or non-conducting. A backward electromagnetic pulse 2386 and a forward electromagnetic pulse 2387 with duration comparable to the length of the quasi charged particle is scattered from the material surface 2384 upon transmission of the quasi-charged particle 225 through the aperture 2382. For efficient backward scattering, the size of the aperture 2382 is smaller than the length of the quasi-charged particle 225. Finally, the quasi charged particle 225 is dumped into the impedance network 2388.

Figure 5:
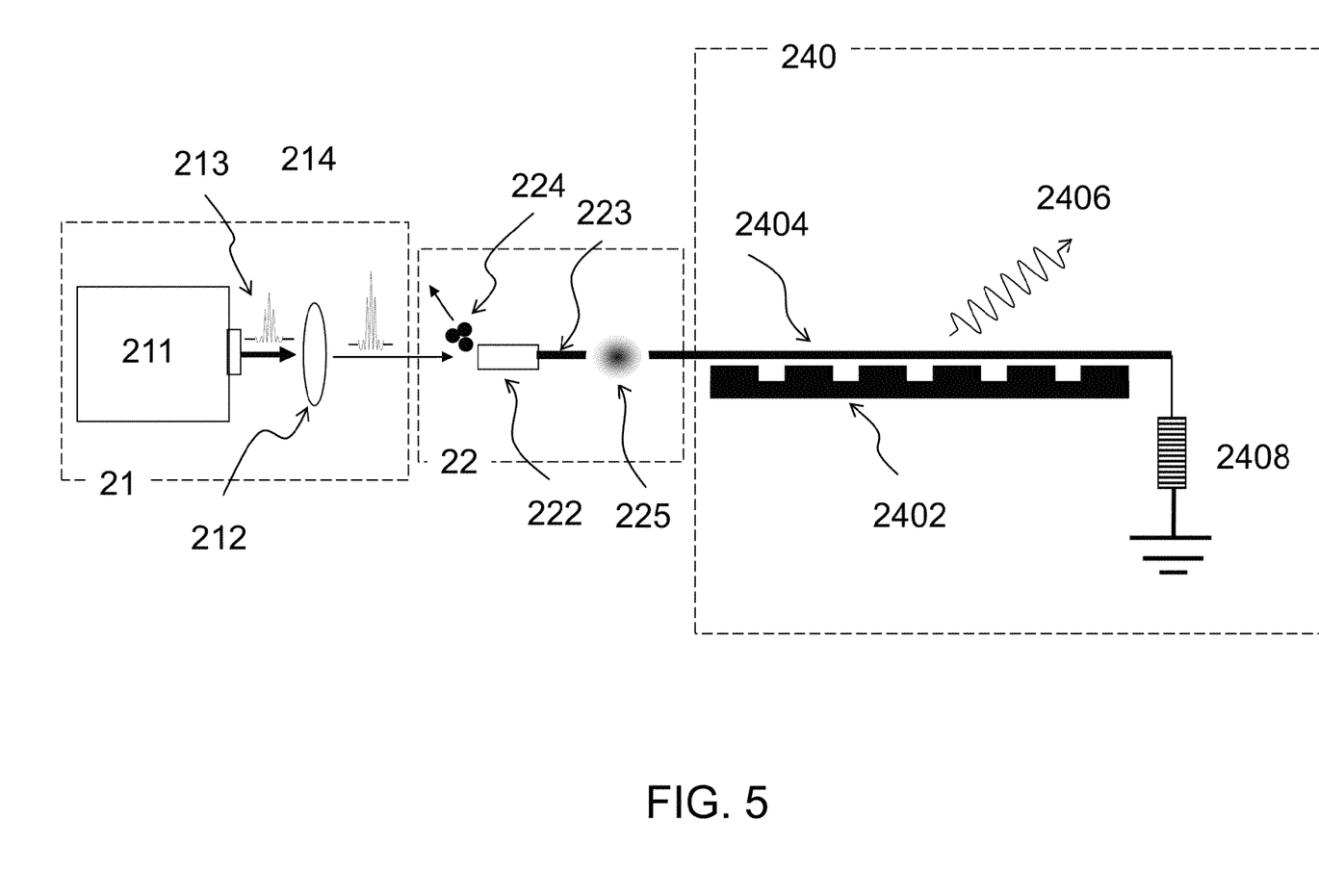
FIG. 5 depicts an antenna system generating a Smith-Purcell like radiation according to a fourth preferred embodiment of the present invention.

Refer to FIG. 5, which shows an antenna system radiating a kind of quasi relativistic radiation, called "quasi Smith-Purcell radiation", according to a fourth preferred embodiment of the present invention. The laser excitation unit 21 first emits an intense laser pulse 214 to excite a quasi charged particle 225 propagating on a conducting wire 223 in the quasi charged particle generation unit 22. The wire 223 carrying the quasi charged particle 225 is extended into a radiation generation unit 240, in which a corrugated grating surface 2402 is arranged next to the wire 2404. The corrugated grating surface 2402 scatters the field of the quasi charged particle 225 and generates a radiation 2406 much similar to a grating scattering the field of a real charged particle flying above to generate the Smith-Purcell radiation. Preferably, the length of the quasi charged particle is smaller than the radiation wavelength. Finally, the quasi charged particle 225 is dumped into the impedance network 2408.

Figure 6:
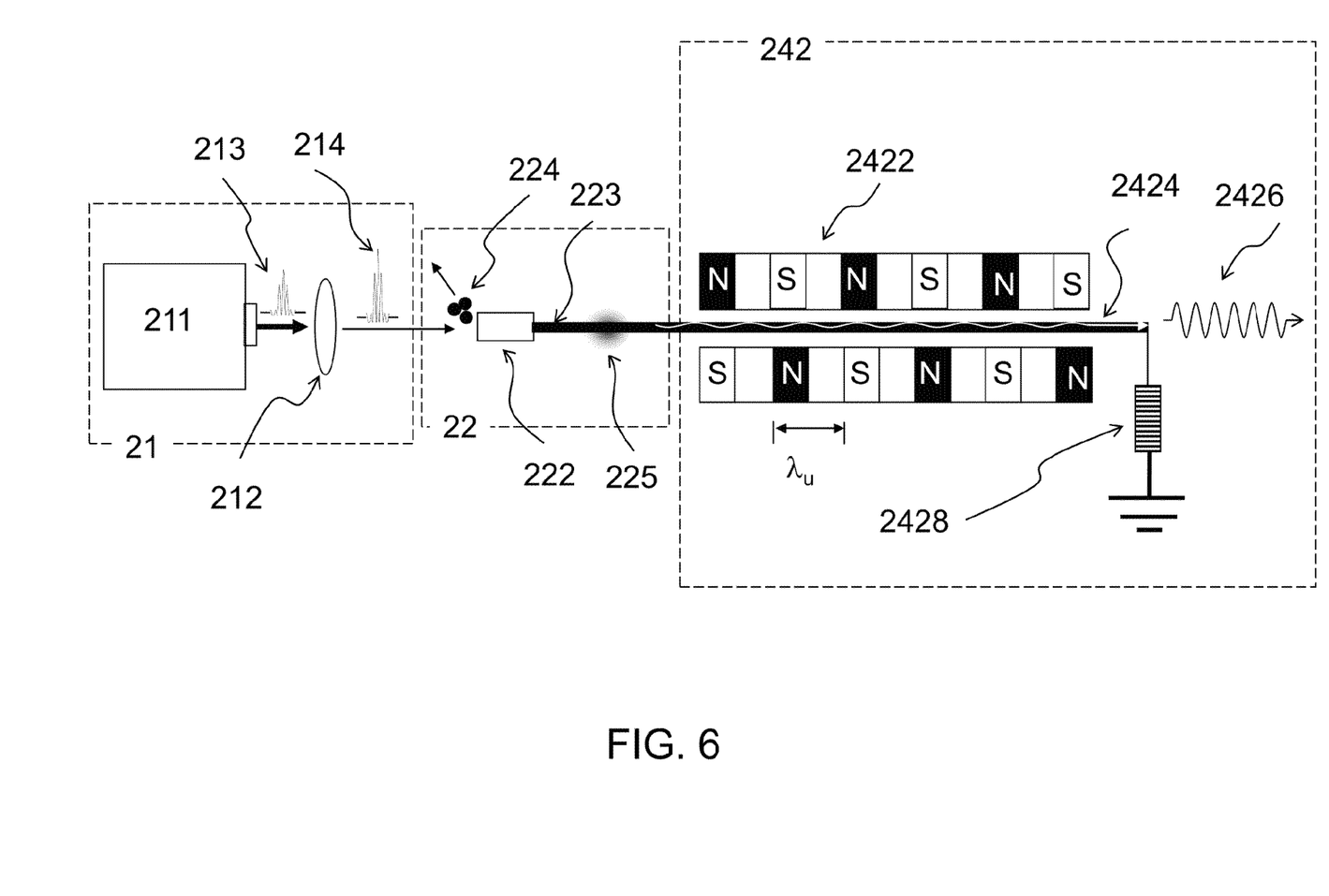
FIG. 6 depicts an antenna system generating a short-wavelength undulator like radiation according to a fifth preferred embodiment of the present invention.

Refer to FIG. 6, which shows an antenna system radiating a kind of quasi relativistic radiation, called "quasi short-wavelength undulator radiation", according to a fifth preferred embodiment of the present invention. The laser excitation unit 21 first emits an intense laser pulse 214 to excite a quasi charged particle 225 propagating on a conducting wire 223 in the quasi charged particle generation unit 22. The wire 223 carrying the quasi charged particle 225 is extended into a radiation generation unit 242 and aligned through the axis of an undulator 2422 in the radiation generation unit 242. Under the alternating magnetic fields in the undulator, the quasi charged particle, while propagating down the wire 2424, performs a quiver motion on the wire to generate radiation in the forward direction much similar to a real relativistic charged particle performing a quiver motion in an undulator to generate a greatly wavelength-contracted undulator radiation. This short-wavelength generation can be readily seen from Eq. (3) with a small D or a small transverse motion of the charge on the thin wire 2424. Preferably, the length of the quasi charged particle is smaller than the radiation wavelength. Finally, the quasi charged particle 225 is dumped into the impedance network 2428.

Figure 7:
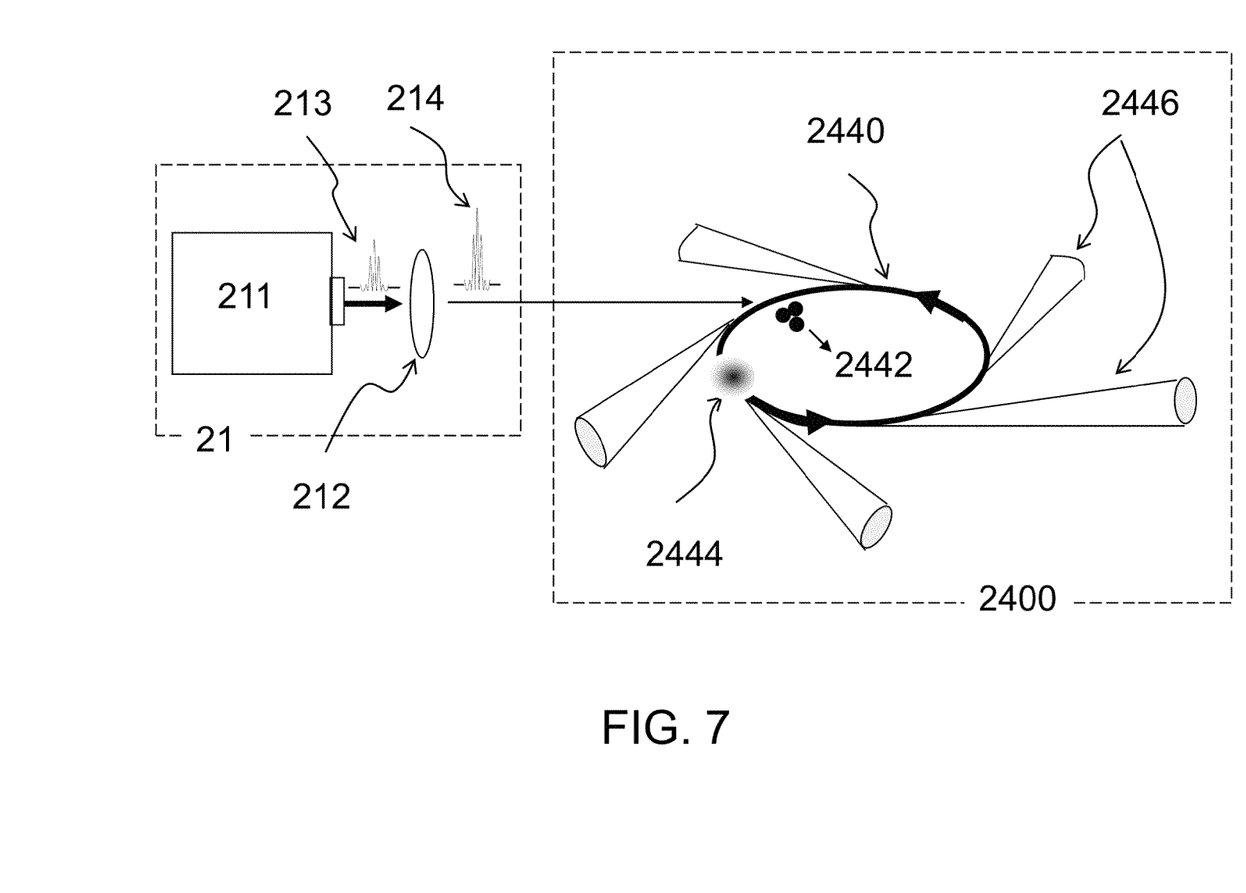
FIG. 7 depicts an antenna system generating a synchrotron like radiation according to a sixth preferred embodiment of the present invention.

Refer to FIG. 7, which shows an antenna system radiating a kind of quasi relativistic radiation, called "quasi synchrotron radiation", according to a sixth preferred embodiment of the present invention. In this preferred embodiment the quasi charged particle generation unit and the radiation generation unit are merged into one 2400. The laser excitation unit 21 first emits an intense laser pulse 214 to knock out electrons 2442 from a spot on a ring-shape conducting wire and simultaneously excite two counter propagating quasi charged particles rotating on it. For clarity, only one quasi charged particle 2444 rotating counterclockwise is depicted in the figure. During the rotational motion, the quasi charged particle emits radiation 2446 along the tangent of the ring wire much similar to a real charge radiating synchrotron radiation along the tangent of a vacuum ring with bending magnets.

Figure 8:
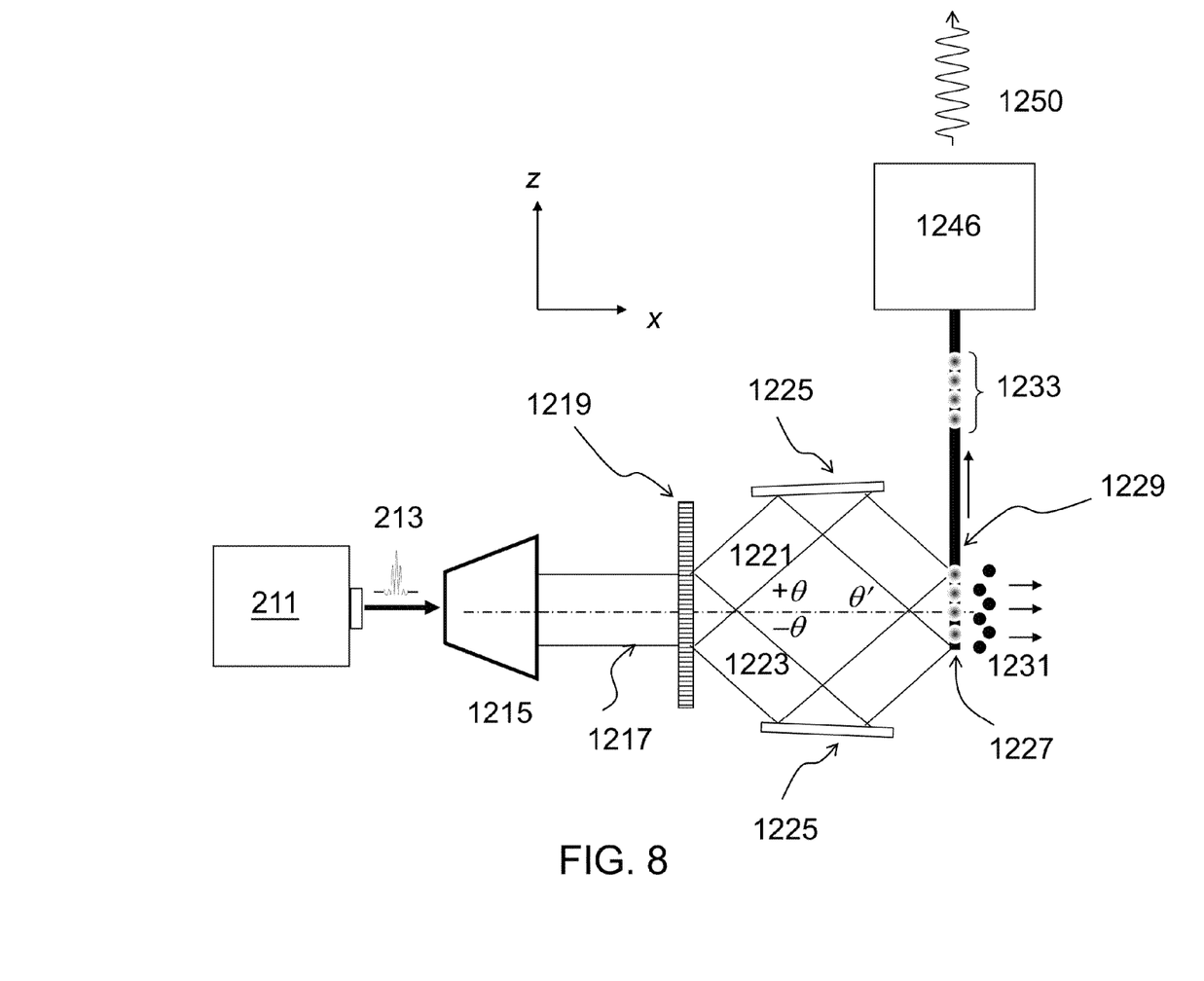
FIG. 8 depicts an apparatus generating a quasi charged particle train for the preferred embodiments of the present invention.

Refer to FIG. 8, which shows a preferred embodiment of a laser excitation system and a quasi charged particle generation system of the present invention. This preferred embodiment is capable of generating a plurality of quasi charged particles or a quasi charged particle train 1233 on a conducting wire 1229 for producing a narrow-line quasi relativistic radiation 1250 in a subsequent radiation generation unit 1246. The laser source 211 emits a short laser pulse 213 that enters a laser collimator 1215 to generate a collimated laser beam 1217. Preferably, the laser collimator 1215 includes a cylindrical lens to focus the laser beam along y. The collimated laser beam 1217 is incident on a beam splitter 1219, exemplified by a phase mask in FIG. 8, which splits the laser into two beams 1221, 1223 propagating at angles±θ with respect to the axis of the laser source 211. Two mirrors 1225 reflect and recombine the two laser beams 1221, 1223 at an angle θ' with respect to the axis, to form interference fringes 1227 on the conducting wire 1229. The bright fringes knock out electrons 1231 from the wire to generate an array of quasi charged particles coinciding with the bright fringes and propagating along the wire 1229. The separation of two adjacent quasi charged particles is equal to λ/sin θ', where λ is the wavelength of the laser source 211. Therefore, the frequency of the propagating quasi charged particles can be adjusted through the parameter θ' by rotating the mirrors 1225. Preferably, the frequency of the propagating quasi charged particles is equal to the designed radiation frequency or one of the sub-harmonics of the designed radiation frequency in the radiation generation unit 1246.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A radiation antenna system, comprising:
    a laser excitation unit, emitting a laser pulse;
    a quasi charged particle generation unit, receiving the laser pulse to knock out a plurality of electrons through photoemission from a conducting wire to induce a pulsed charge wave carrying a net charge, called a quasi charged particle, and traveling on the conducting wire; and
    a radiation generation unit, having the conducting wire carrying the quasi charged particle therein moving with a component toward a radiation detector and generating a quasi relativistic electromagnetic radiation collected by the radiation detector.

2. The radiation antenna system according to claim 1, wherein the laser excitation unit includes a laser source generating a laser pulse having photon energy higher than the work function for single-photon photoemission from the conducting wire.

3. The radiation antenna system according to claim 1, wherein the laser excitation unit includes a laser source generating an intense laser pulse for multi-photon photoemission from the conducting wire.

4. The radiation antenna system according to claim 3, wherein the quasi charged particle generation unit includes an anode electrode, biased with a positive voltage from a power supply and arranged adjacent to the laser illuminating spot on the wire, called the photoemitter, to assist the multi-photon photoemission through the Schottky effect.

5. The radiation antenna system according to claim 1, wherein the laser excitation unit includes a laser source generating a laser pulse whose pulse length is shorter than the wavelength of the radiation generated from the radiation generation unit.

6. The radiation antenna system according to claim 1, wherein the laser excitation unit includes a laser source generating a single laser pulse.

7. The radiation antenna system according to claim 1, wherein the laser excitation unit includes a laser source generating a laser pulse train having a frequency equal to the designed radiation frequency or one of the sub-harmonics of the designed radiation frequency of the radiation generation unit.

8. The radiation antenna system according to claim 1, wherein the quasi charged particle generation unit, upon excitation by the laser source in claim 6, generates a single quasi charged particle having a particle length shorter than the designed radiation wavelength in the radiation generation unit.

9. The radiation antenna system according to claim 1, wherein the quasi charged particle generation unit generates a train of quasi charged particles with a temporal separation between adjacent particles equal to the temporal period or an integer multiple of the temporal period of the radiation wave from the radiation generation unit.

10. The quasi charged particle generation unit of claim 9, wherein the plurality of quasi charged particles are generated by illuminating the conducting wire with a plurality of interference fringes produced by a first and a second interfering laser beams split from the laser source in claim 6.

11. The quasi charged particle generation unit of claim 9, wherein the plurality of quasi charged particles are generated by illuminating a single spot on the conducting wire with the laser source in claim 7.

12. The radiation antenna system according to claim 1, wherein the radiation generation unit is a structured conducting wire selected from a group consisting of: a bent wire, a ring wire, a helical wire, a pitched-modulated helical wire, a diameter-modulated helical wire, a sinusoidal wire, a period-modulated sinusoidal wire, and a straight wire.

13. The radiation antenna system according to claim 1, wherein the radiation generation unit is the conducting wire pulled through an aperture in a material plate.

14. The radiation antenna system according to claim 1, wherein the radiation generation unit is the conducting wire installed along the axis of an undulator.

15. The radiation antenna system according to claim 1, wherein the radiation generation unit is the conducting wire next to a corrugated material surface.

16. The radiation antenna system according to claim 1, wherein the conducting wire in the quasi charged particle generation unit and the radiation generation unit is installed in vacuum.

* * * * *